(12) United States Patent
Li et al.

(10) Patent No.: US 9,871,366 B1
(45) Date of Patent: Jan. 16, 2018

(54) LEAKAGE CURRENT DETECTION AND PROTECTION DEVICE

(71) Applicant: Chengli Li, Suzhou (CN)

(72) Inventors: Chengli Li, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 0 days.

(21) Appl. No.: 15/586,952

(22) Filed: May 4, 2017

Related U.S. Application Data

(63) Continuation-in-part of application No. 15/209,563, filed on Jul. 13, 2016.

(30) Foreign Application Priority Data

Apr. 1, 2017 (CN) .......................... 2017 1 0212497
Apr. 1, 2017 (CN) ...................... 2017 2 0344493 U

(51) Int. Cl.
| | |
|---|---|
| G08B 21/00 | (2006.01) |
| G01R 31/02 | (2006.01) |
| H02H 3/04 | (2006.01) |
| H02H 3/08 | (2006.01) |
| H02H 1/00 | (2006.01) |
| H02H 1/06 | (2006.01) |

(52) U.S. Cl.
CPC .......... *H02H 3/044* (2013.01); *H02H 1/0007* (2013.01); *H02H 1/06* (2013.01); *H02H 3/08* (2013.01)

(58) Field of Classification Search
CPC ............ H02H 3/044; H02H 1/06; H02H 3/08; H02H 1/0007
USPC ..................... 324/750.2, 750.3, 424; 340/664
See application file for complete search history.

(56) References Cited

U.S. PATENT DOCUMENTS

| | | | |
|---|---|---|---|
| 2012/0119918 A1* | 5/2012 | Williams | ........... G01R 31/3277 340/664 |
| 2014/0117995 A1 | 5/2014 | Topucharla | |

* cited by examiner

*Primary Examiner* — Farhana Hoque
(74) *Attorney, Agent, or Firm* — Chen Yoshimura LLP

(57) ABSTRACT

A leakage current detection device includes a switching module coupled between power input and output terminals, for controlling the electrical connection between the input and output terminals; a leakage current detection module, including a switch driving component, configured to control the switching module based on working periods of the switch driving component and based on whether a leakage current signal is detected; and a first self testing module, coupled to the leakage current detection module, for periodically generating a self testing pulse signal as a simulated leakage current signal. The first self testing module includes: a periodic timing circuit and a self testing pulse signal generating circuit coupled to each other, where the periodic timing circuit controls the period of the self testing pulse signal. The device provides enhanced safety protection.

17 Claims, 8 Drawing Sheets

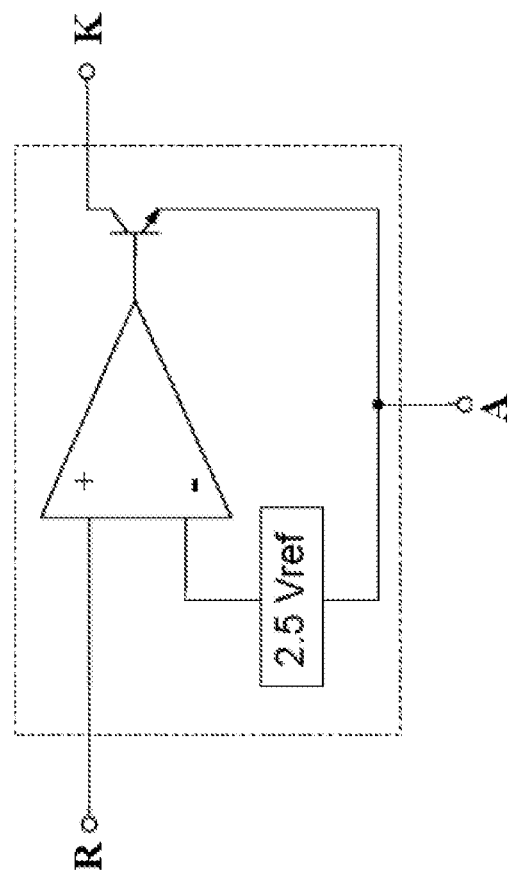
Fig. 8
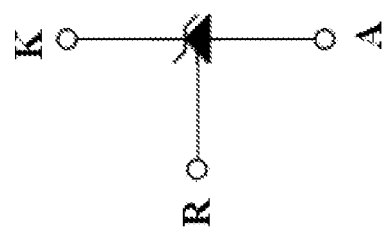

LEAKAGE CURRENT DETECTION AND PROTECTION DEVICE

BACKGROUND OF THE INVENTION

Field of the Invention

This invention relates to the field of electrical appliances, and in particular, it relates to a leakage current detection and protection device having a self-test function.

Description of the Related Art

Electrical appliances are widely used in households as well as industrial applications, and their safety is an important issue. Typically, leakage current protection devices are provided at electrical outlets and in plugs for electrical appliances for safety purposes. Such devices are often labeled with clearly visible signs such as "test before use" to remind the users to test the proper functioning of the leakage current protection devices. However, in practical use, due to environmental factors or installation, there is still a possibility that the leakage current protection device may malfunction during use, even if the user has tested it before use. This can be dangerous. For example, in a water heater, the electrical heating coil may become rusty or its insulating layer may be damaged due to prolonged contact with water. This may cause a leakage current which may be conducted by the water in the tank. In this situation, if the user uses water such as for a shower, electrical shock may occur, causing harm to the user.

Therefore, a leakage current detection and protection device with self-testing function is needed.

SUMMARY OF THE INVENTION

To solve the above problems, embodiments of the present invention provide a leakage current detection device that has both leakage current detection function and self test function, which can improve safety for users.

To achieve these and other advantages and in accordance with the purpose of the present invention, an embodiment of the present invention provides a leakage current detection device for an AC power source, which includes: a switching module coupled between a power input terminal and a power output terminal, for controlling electrical connection between the power input and power output terminals; a leakage current detection module including a leakage current detector ring for detecting a leakage current signal and a switch driving component, the leakage current detection module being configured to control the switching module based on working periods of the switch driving component and based on whether a leakage current signal is detected; and a first self testing module, coupled to the leakage current detection module, configured to periodically generate a self testing pulse signal as a simulated leakage current signal to be detected by the detector ring, wherein the first self testing module includes a periodic timing circuit and a self testing pulse signal generating circuit coupled to each other, wherein the periodic timing circuit controls a period of the self testing pulse signal.

In one embodiment, the self testing pulse signal generating circuit includes a switching device, wherein the periodic timing circuit is coupled to the switching device to control a conductive state of the switching device, wherein the switching device generates the self testing pulse signal when it is controlled by the periodic timing circuit to be conductive, and wherein a timing component of the periodic timing circuit is discharged via the leakage current detection module or via the leakage current detection module and a first discharge path.

In one embodiment, the first self testing module and the switch driving component respectively operate in different half cycles of the AC power source.

In one embodiment, the self testing pulse signal generating circuit further includes a shunt reference coupled in series with the switching device, and wherein the periodic timing circuit is coupled to the shunt reference to control the conductive state of the switching device.

In one embodiment, the first self testing module includes a power supply module for supplying a power to the self testing pulse signal generating circuit and/or the periodic timing circuit.

In one embodiment, the power supply module supplies power only to the self testing pulse signal generating circuit, and wherein the periodic timing circuit is coupled to directly receive power from the AC power source.

In one embodiment, the first self testing module and the switch driving component respectively operate in the same half cycle of the AC power source, and wherein the timing component of the periodic timing circuit is discharged via the first discharge path.

In one embodiment, the first discharge path becomes conductive before a discharge path of the leakage current detection module becomes conductive.

In one embodiment, the self testing pulse signal generating circuit further includes an operational amplifier, an output of the operational amplifier being coupled to the switching device, a non-inverting input of the operational amplifier being coupled to a biasing circuit, and an inverting input of the operational amplifier being coupled to the periodic timing circuit.

In one embodiment, the self testing pulse signal generating circuit further includes a light emitting device coupled in series with the switching device.

In one embodiment, the leakage current detection device further includes a second self testing module, which includes a resistor, a reset button and a wire passing through the leakage current detector ring, wherein when the reset button is depressed, a simulated leakage current is generated on the wire.

In one embodiment, the periodic timing circuit is coupled to the switching device via a voltage regulator, wherein the current regulator increases the period of the self testing pulse signal.

In one embodiment, the leakage current detection device further includes a voltage regulator coupled in parallel with the timing component.

In one embodiment, the first discharge path is coupled to an output of a leakage current detection chip of the leakage current detection module.

In embodiments of the present invention, by providing the first and second self testing circuits, the user can test the proper function of the device before use, and the device can also periodically self test its leakage current detection and protection function during use of the device and provide the user corresponding alerts, which greatly enhances the safety of the device.

BRIEF DESCRIPTION OF THE DRAWINGS

Embodiments of the invention are described with reference to the following drawings. In the drawings, similar components are designated with similar reference symbols.

FIG. 8 illustrates the model and equivalent circuit of a shunt reference.

DETAILED DESCRIPTION OF THE PREFERRED EMBODIMENTS

Embodiments of the present invention are described with reference to the drawings. The drawings illustrate the embodiments of the present invention, but are intended to show all embodiments. It will be apparent to those skilled in the art that, without departing from the spirit of the invention, other embodiments may be used, and structural or logical modification and variations can be made. Thus, it is intended that the present invention cover modifications and variations that come within the scope of the appended claims and their equivalents.

Embodiments of the present invention provides a leakage current detection and protection device, which can perform self testing prior to use to determine whether the leakage current detection and protection functions are normal, and can also perform self testing during use. Based on such principles, the leakage current detection and protection device includes a leakage current detection module, a switching module and a self testing module. Prior to use, the user cay use the self testing module to generate a simulated leakage current, to determine whether the leakage current detection and protection module is functioning property; during use, the self testing module can periodically generate a leakage current signal to test the leakage current detection module.

Figure 1:
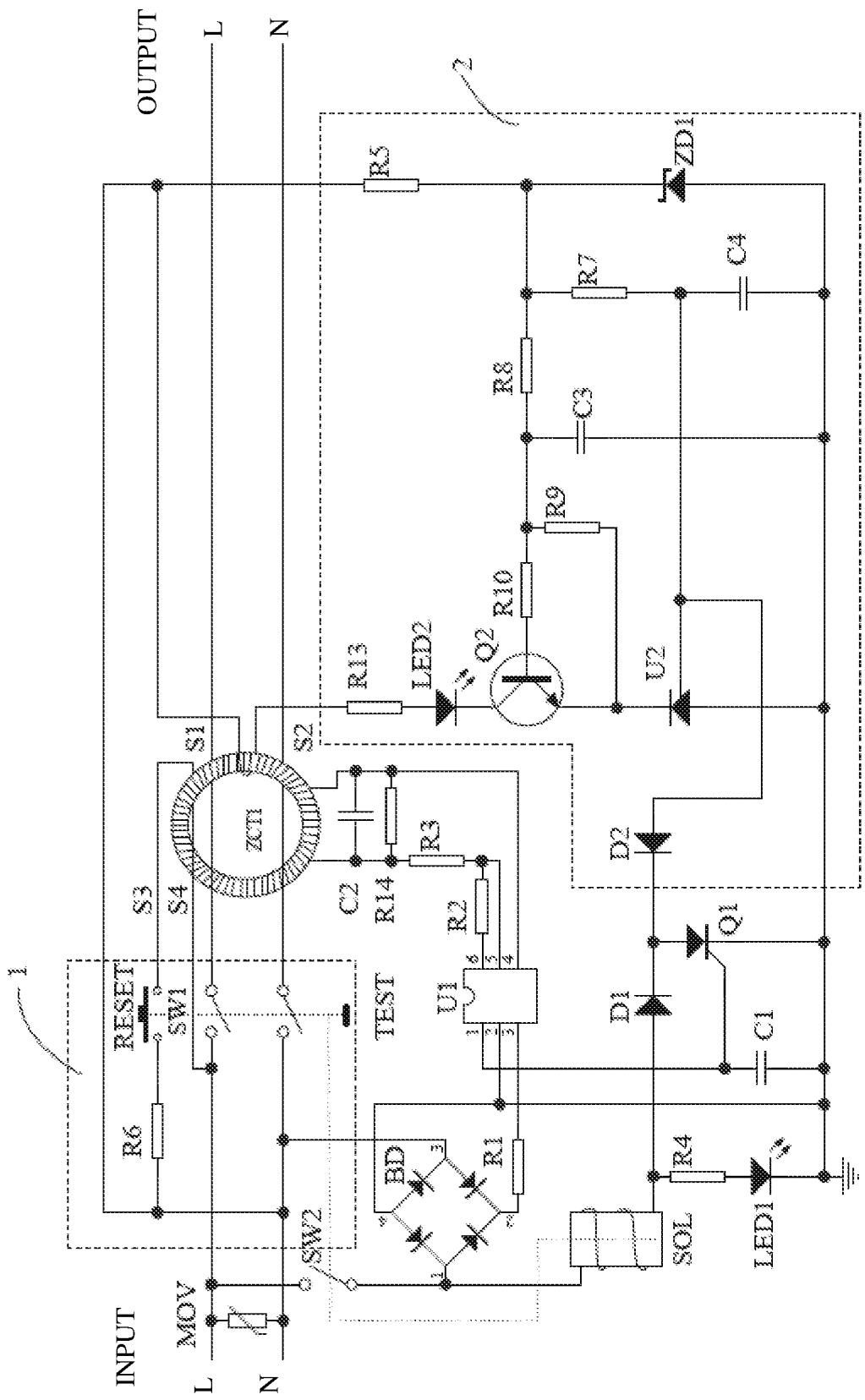
FIG. 1 is a circuit diagram showing the structure of a leakage current detection and protection device according to a first embodiment of the present invention.

FIG. 1 is a circuit diagram showing the structure of a leakage current detection and protection device according to a first embodiment of the present invention. As shown in FIG. 1, the leakage current detection and protection device has a power input terminal INPUT, and power output terminal OUTPUT, and a switch SW1 that controls the electrical current connection and disconnection between the input end INPUT and the output end OUTPUT. The electrical power lines (L and N) pass through the leakage current detection ring ZCT. When the currents on the hot line (L) and the neutral line (N) are balanced, the leakage current detection ring ZCT does not experience a current imbalance. When the currents on the hot line (L) and the neutral line (N) are not balanced, i.e. when there is a leakage current signal, the leakage current detection ring ZCT generates a corresponding voltage signal. A rectifier circuit BD is respectively coupled to the power supply lines and the leakage current detection chip U1, to take power from the power supply lines to supply the leakage current detection chip U1. The leakage current detection chip U1 is coupled to the leakage current detection ring ZCT, for detecting whether the leakage current detection ring ZCT1 has a voltage signal; it further drives the silicon controlled rectifier (SCR) Q1 to become conductive. When SCR Q1 is conductive, the winding of a switch actuator (such as a solenoid SOL) will have a relatively large current change, thereby opening the switch SW1.

Based on the principle of the instant invention, the self testing module of the leakage current detection and protection device includes a self testing circuit 1 which provides a pre-use testing for leakage current detection and protection function, and a self testing circuit 2 for periodically generating a simulated leakage current. Self testing circuits 1 and 2 are described in more detail below.

The self testing circuit 1 includes resistor R6, reset button (switch) RESET and conductor wires S3 and S4 that pass through the leakage current detector ring ZCT. The self testing circuit 1 provides pre-use self testing for the leakage current detection and protection function. After the input terminal INPUT is connected to the electrical power, if the reset button RESET is pressed, the switch SW2 will close, and a current path between the hot line (L) and neutral line (N) is formed via resistor R6 and the reset switch RESET. The leakage current detector ring ZCT detects the current change on the conductor S4 and generates a corresponding induced voltage signal. When the leakage current detector chip U1 detects the voltage signal generated by the detector ring ZCT and confirms that it reaches a predetermined level, it drives the SCR Q1 to conduct. This in turn generates a current in the solenoid SOL to generate a magnetic field, which controls the switch RESET to be open. As a result, the self testing circuit 1 is open, the leakage current detection and protection device is reset, and the switch SW1 is closed to electrically connect the input terminal and the output terminal.

The self testing circuit 2 provides periodic testing for the leakage current detection and protection function. The self testing circuit 2 includes a power supply circuit, a periodic timing circuit, and a self testing pulse signal generating circuit for generating a pulse signal as the simulated leakage current self testing signal. Refer to FIG. 1, the power supply circuit includes resistor R5, resistor R8, voltage regulator ZD1 and capacitor C3. The periodic timing circuit includes resistor R7 and a timing element (such as capacitor C4) which are connected in series. The self testing pulse signal generating circuit includes a transistor Q2, adjustable shunt reference U2, diode D2 and resistors R9, R10 and R13 which are respectively connected to the emitter, base and collector of transistor Q2. After the leakage current detection and protection device is reset, the self testing circuit 2 periodically applies to the detector ring a simulated leakage current signal that reaches the predetermined level. The test button TEST is configured such that, when the device is in the reset state and the input terminal is not yet connected to the power source, pressing the TEST button will cut off the electrical connection between the input terminal and the output terminal.

More specifically, one end of resistor R8 is coupled between resistor R5 and the voltage regulator ZD1, and the other end of resistor 81 is coupled to the note between resistors R9 and R10 and is also coupled to ground via capacitor C3. It can be seen that that power supply circuit supplies a stable DC working voltage for the shunt reference U2 and transistor Q2. Further, the power supply circuit supplies a charging current for the periodic timing circuit, i.e., it charges capacitor C4. By setting the values of resistor R7 and capacitor C4, the period of the self testing can be set. The self testing pulse signal generating circuit generates a self testing pulse signal which is a simulated leakage current signal. Resistors R9 and R10 provide the base bias voltage of transistor Q2, so that transistor Q2 causes the self testing pulses to be generated during the half cycle of the AC signal when no current passes through the solenoid SOL. Resistor R9 limits the current that flows through the shunt reference U2. The shunt reference U2 allows resistor Q2 to be conductive only when the time period determined by the resistor R7 and capacitor C4 is up, to generate the leakage current pulse signal.

FIG. 8 shows the model and equivalent circuit of the shunt reference. As shown in FIG. 8, the shunt reference U2 is adjustable at three terminals, including cathode (K), anode (A) and reference terminal (R). The shunt reference U2 may be equivalent to an operational amplifier (Op Amp), a 2.5 V reference source, and a transistor. The inverting input of the Op Amp is coupled to the 2.5 V reference source, and its non-inverting input is coupled to the reference terminal R. The transistor is coupled to the output of the Op Amp. Based on this equivalent circuit, it can be seen that when the voltage at the non-inverting input of the Op Amp (i.e. the R terminal) is very close to the reference voltage 2.5 V, by slightly changing the voltage at the R terminal, the current through the transistor can be controlled to vary between 1 mA to 100 mA. When the voltage at the non-inverting input of the Op Amp is below the reference voltage 2.5 V, the transistor is off. Therefore, the circuit of this embodiment uses the working characteristics of the internal Op Amp and transistor of the shunt reference U2 to achieve the On/Off of the periodic timing function. It should be understood that, to improve the stability o the circuit, the shunt reference U2 should have good thermal stability. The shunt reference U2 may alternatively be replaced by other controllable switch or similar elements.

For ease of description, the description below uses the example where the leakage current detection circuit operates in the positive half cycles of the AC power and the self testing circuit 2 operates in the negative half cycles. It should be understood that the positive and negative half cycles in this example are not limiting.

The operation of the self testing circuit 2 is as follows:

After the device is reset, the voltage on capacitor C4 is zero, so the voltage at the reference terminal R of the shunt reference U2 is lower than the reference voltage 2.5 V. Thus the internal transistor of the shunt reference U2 is off and the shunt reference U2 is not conductive. During the negative half cycle, although a positive bias is present at the base of transistor Q2, because the emitter of transistor Q2 is coupled to ground via the shunt reference U2, when the shunt reference U2 is non-conductive, the transistor Q2 is non-conductive and therefore does not generate a leakage current signal. The power supply circuit charges capacitor C4 via resistor R7. When the voltage across capacitor C4 is charged to 2.5 V or above, the internal transistor of the shunt reference U2 becomes conductive. In turn, the transistor Q2 which has a positive bias at its base becomes conductive. Thus, a current flows between the neutral line and ground through conductors S1 and S2 which passed through the detector ring ZCT, and a leakage current pulse signal is generated in the detector ring ZCT. When the leakage current detector chip U1 detects the leakage current pulse signal, it drives SCR Q1 to become conductive. Because the solenoid can only form a current path in its coils during positive half cycles of the power source, the switch SW1 will not trip; at this time, capacitor C4 is rapidly discharged via diode D2 and SCR Q1. With the discharging, the voltage across capacitor C4 drops below 2.5 V, so the internal transistor of U2 is off, and in turn transistor Q2 is off, which completes one self testing cycle. The timing of the next self testing cycle starts by charging of capacitor C4.

The operation of the leakage current detection and protection circuit when malfunction exists:

The loss of leakage current detection and protection function can include without limitation the following situations: electrical components of the leakage current detection circuit (such as detector ring ZCT, resistors R3 and R14, etc.) are open or shorted, or the leakage current detection chip U1 is damaged, etc. When such a situation occurs, the leakage current detection chip U1 will not be able to drive the SCR Q1 to conduct; in other words, the solenoid SOL will not be able to control the switch SW1 normally.

When the self testing circuit 2 generates a self testing pulse signal, because the leakage current detection chip U1 cannot drive SCR Q1 to conduct, capacitor C4 cannot be discharged via SCR Q1. Because the voltage across capacitor C4 remains at a high level, the shunt reference U2 remains conductive, so that the light emitting diode LED2 is continuously illuminated, which alerts the user that the device is malfunctioning. It should be understood that, in this embodiment, if the leakage current detection and protection circuit functions normally, the light emitting diode LED2 will flash but will not be continuously illuminated. When the user becomes aware of the malfunction, the user may depress the test button TEST, which will disconnect the electrical connection between the input terminal and the output terminal via a mechanical disconnect mechanism. This also causes a blocking member below the reset button RESET to return to its position where it blocks the reset button. Then, when the reset button RESET is pressed again, the self testing circuit 1 generates a simulated leakage current signal, but because the leakage current detection function is lost, a current cannot flow through the coil of the solenoid SOL. Consequently, the blocking member below the reset button RESET cannot move, so it prevents the reset button from moving downwardly any further. As a result, the input terminal and output terminal cannot be electrically connected, i.e., the device cannot be reset. Therefore, the user cannot use the device, and the user's safety can be ensured.

When the solenoid SOL or the SCR Q1 is an open circuit, the reset button is blocked by the blocking member and cannot reset the device, so the output terminal is disconnected. If this type of malfunctioning occurs when the device is in the reset state, the user can press the test button TEST to disconnect the connection between the input and output terminals, and then when the user presses the reset button RESET, the device will not reset due to the above-described reasons.

When the SCR Q1 is a short circuit, a continuous high current will flow through the solenoid SOL. In such a state, as soon as the reset button RESET is pressed down, the device will trip again. As a result, the connection between the input and output terminals cannot be maintained.

In summary, in this embodiment, the self testing circuit 1 allows the user to manually test whether the leakage current detection and protection function is lost when the user presses the reset button. The self testing circuit 2 allows for periodic testing of the proper function of the leakage current detection and protection function during normal use of the device; when the leakage current detection and protection device is malfunctioning, the waning red LED2 light is lit, informing the user to press the test button TEST to disconnect the output terminal.

Figure 2:
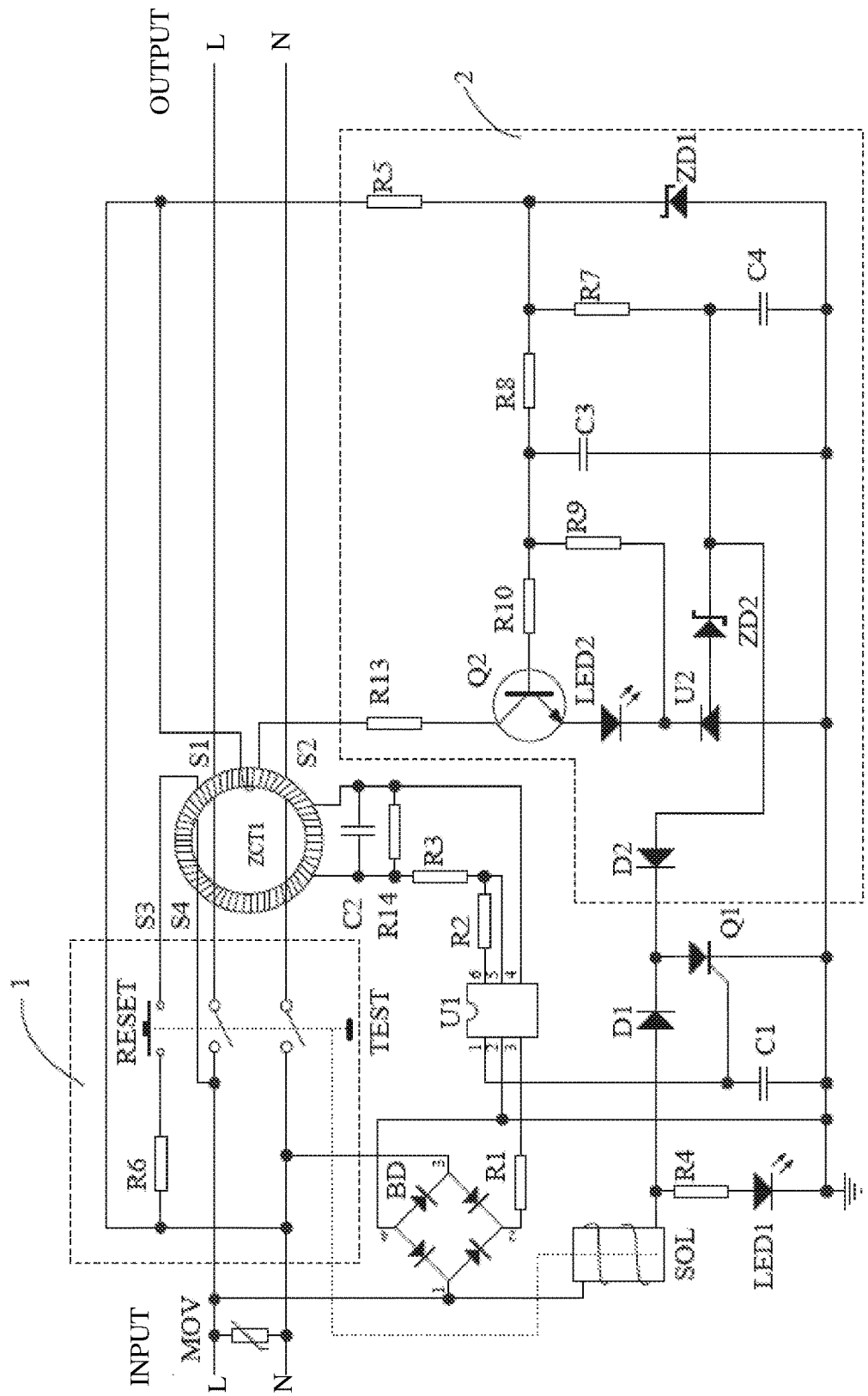
FIG. 2 is a circuit diagram showing the structure of a leakage current detection and protection device according to a second embodiment of the present invention.

FIG. 2 is a circuit diagram showing the structure of a leakage current detection and protection device according to a second embodiment of the present invention.

Compared to the embodiment of FIG. 1, in FIG. 2, the self testing circuit 2 additionally includes a voltage regulator ZD2 at the reference terminal of the shunt reference U2. Thus, to make the shunt reference U2 conductive, the voltage on the capacitor C4 needs to be higher; i.e., to make the internal transistor of U2 conductive, the voltage at the reference terminal of the shunt reference U2 needs to be at least the regulated voltage value of ZD2 plus 2.5 V. Thus, because the voltage required on capacitor C4 is higher, the period of the periodic self testing will increase, so the overall time duration of the current flow in the self testing circuit is shorter, so the power consumption on resistors R9, R10 and R13 of the self testing circuit is reduced. In this embodiment, the light emitting diode LED2 is coupled in series at the emitter of the transistor Q2. When the capacitor C4 cannot discharge via the SCR Q1, the light emitting diode LED2 is continuously lit.

Figure 3:
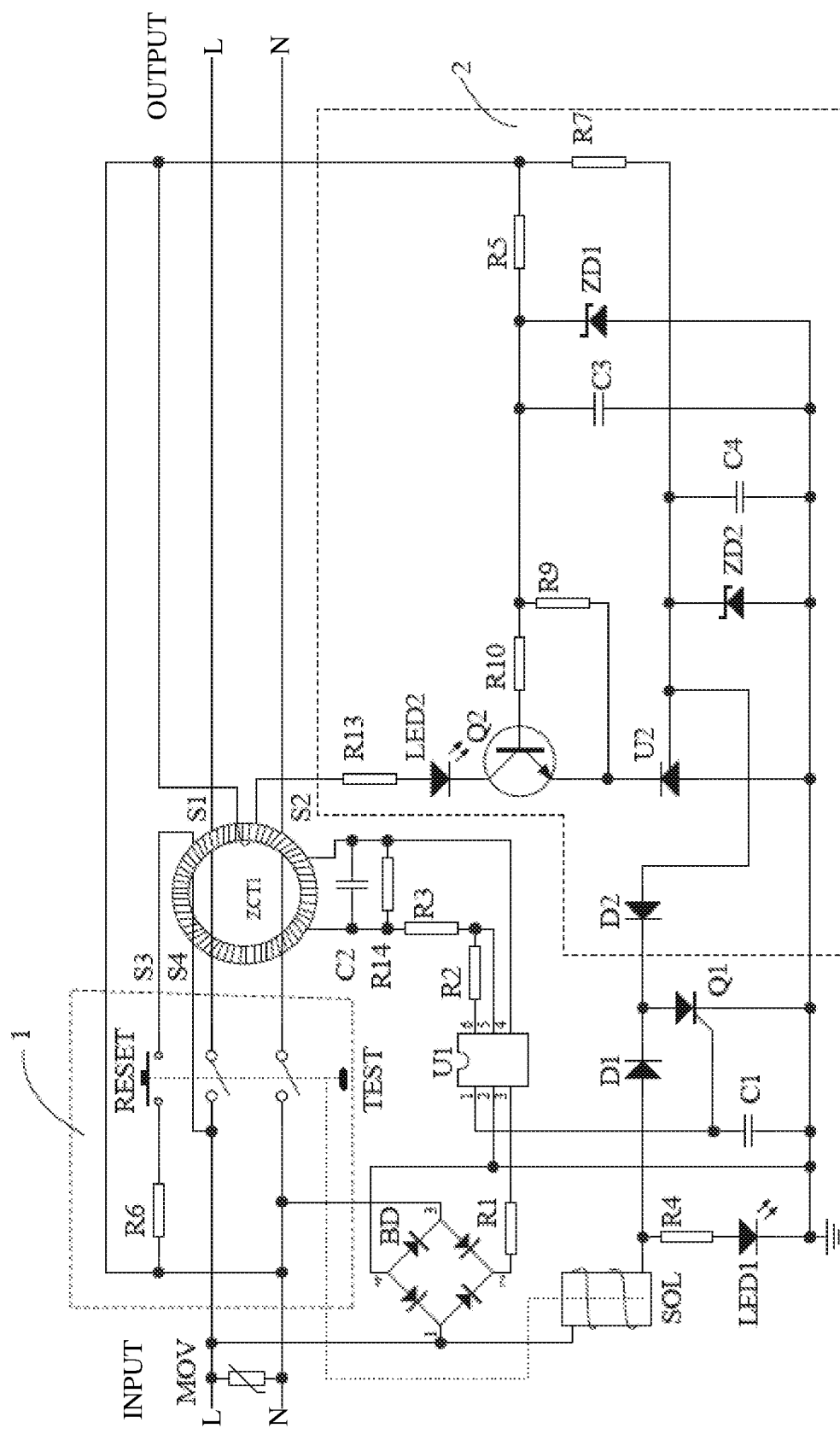
FIG. 3 is a circuit diagram showing the structure of a leakage current detection and protection device according to a third embodiment of the present invention.

FIG. 3 is a circuit diagram showing the structure of a leakage current detection and protection device according to a third embodiment of the present invention.

As shown in FIG. 3, different from FIG. 1, in the self testing circuit 2, resistor R5, voltage regulator ZD1 and capacitor C3 provide a stable DC supply for the shunt reference U2 and transistor Q2. In this embodiment, the periodic timing circuit is modified to: Capacitor C4 is coupled via resistor R7 directly to winding S1 and S2, i.e., capacitor C4 obtains power from the AC source directly during negative half cycles. The self testing period is determined by the values of resistor R7 and capacitor C4. Further, the voltage regulator ZD2 and capacitor C4 are coupled in parallel, for protecting capacitor C4 and the R terminal of the shunt reference U2 from breakdown due to high voltage.

Figure 4:
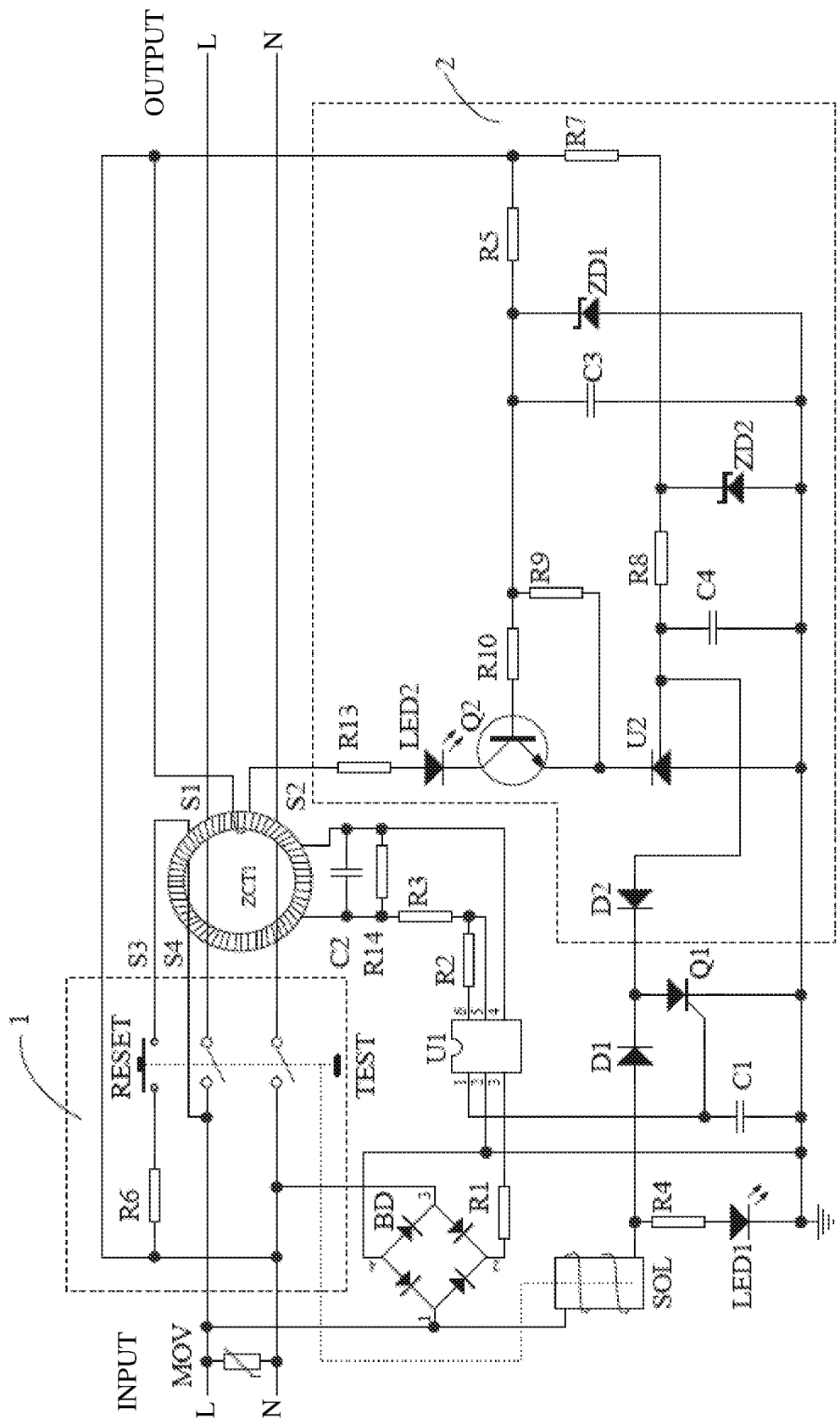
FIG. 4 is a circuit diagram showing the structure of a leakage current detection and protection device according to a fourth embodiment of the present invention.

FIG. 4 is a circuit diagram showing the structure of a leakage current detection and protection device according to a fourth embodiment of the present invention.

As shown in FIG. 4, different from FIG. 1, in the self testing circuit 2, the power supply circuit includes resistor R5, voltage regulator ZD1 and capacitor C3, for providing a stable DC supply for the shunt reference U2 and transistor Q2. The periodic timing circuit includes resistor R8 and capacitor C4; resistor R8 is connected in series to resistor R7, and the voltage regulator ZD2 is coupled between the node between R7 and R8 and ground. Thus, the voltage at the R terminal of the shunt reference U2 is limited to or below the regulated voltage of voltage regulator ZD2. Even if the voltage regulator ZD2 is damaged, the current on that current path can still be limited by setting the values of resistor R7 and/or resistor R8. Therefore, resistor R7 and voltage regulator ZD2 provide a safe voltage source for the periodic timing circuit; meanwhile, by setting the values of resistor R8 and capacitor C4, the period of the periodic self testing can be set.

Figure 5:
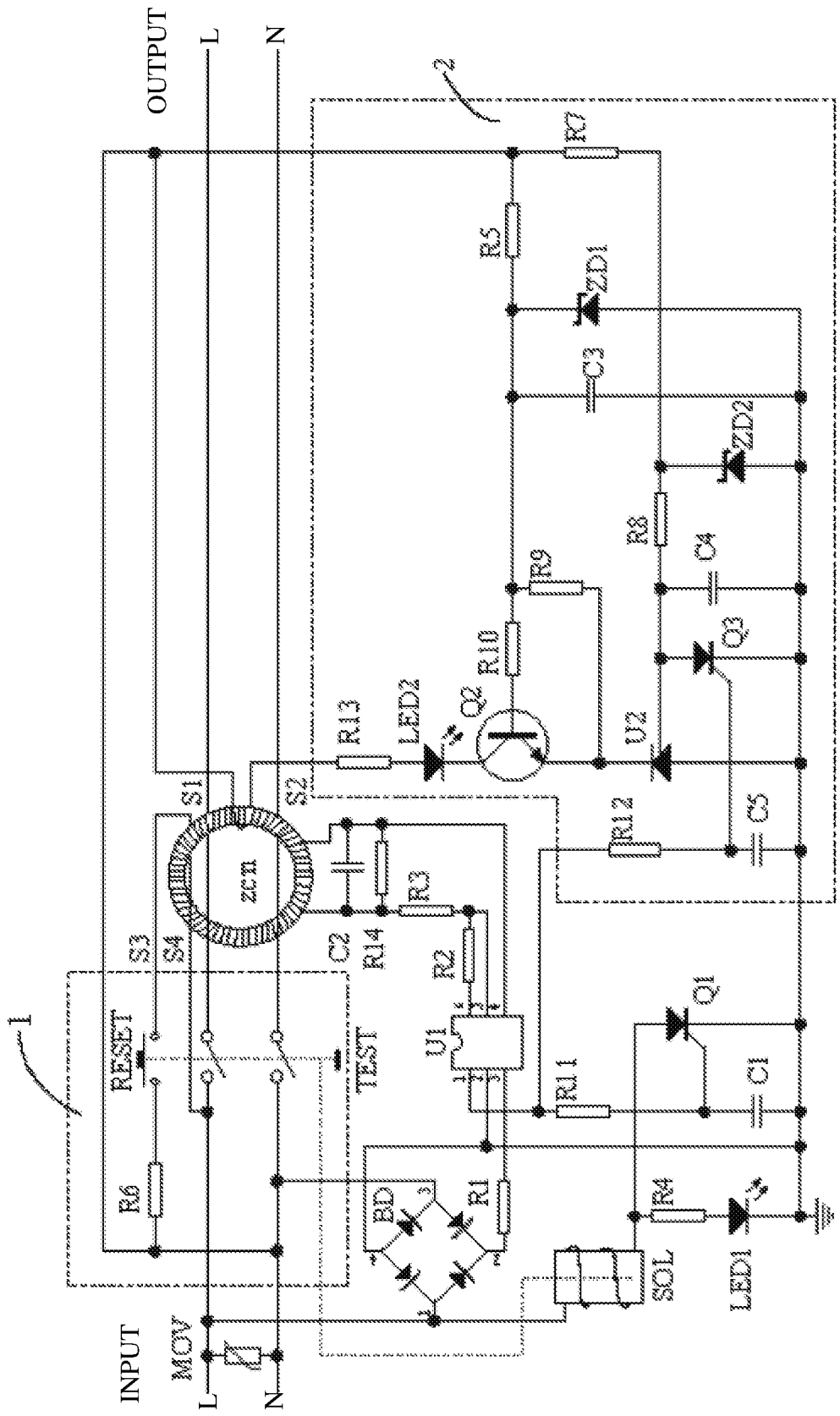
FIG. 5 is a circuit diagram showing the structure of a leakage current detection and protection device according to a fifth embodiment of the present invention.

FIG. 5 is a circuit diagram showing the structure of a leakage current detection and protection device according to a fifth embodiment of the present invention.

As shown in FIG. 5, different from FIG. 4, the self testing circuit 2 additionally includes resistor R11, resistor R12, SCR Q3 and capacitor C5. SCR Q3 and capacitor C4 are connected in parallel. Thus, when SCR Q3 is conductive, capacitor C4 can discharge via SCR Q3. More specifically, when the periodic self testing pulse signal is output, the leakage current detector chip U1 output a SCR drive signal, which drives the SCR Q3 via resistor R12 and capacitor C5, to make the SCR Q3 conductive. Thus, capacitor C4 is discharged, which starts the next self testing period. While driving SCR Q3, the leakage current detection drive signal also applies, via resistor R11 and capacitor C1, a voltage to the control gate of the SCR Q1 which is sufficient to turn on the SCR Q1. However, because the self testing pulse is generated in the negative half cycle, when the solenoid SOL does not form a current path, the switch SW1 remains closed.

Figure 6:
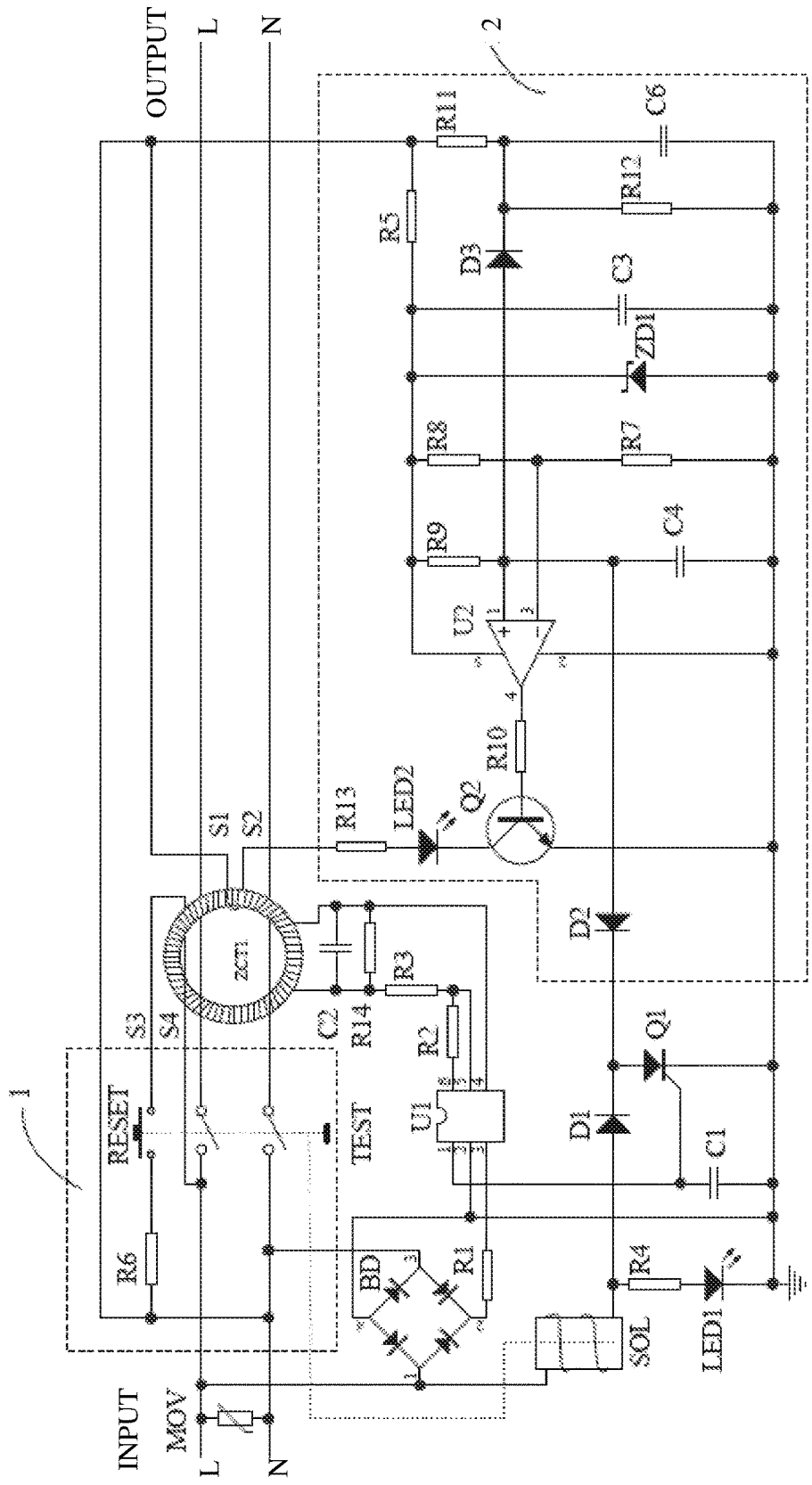
FIG. 6 is a circuit diagram showing the structure of a leakage current detection and protection device according to a sixth embodiment of the present invention.

FIG. 6 is a circuit diagram showing the structure of a leakage current detection and protection device according to a sixth embodiment of the present invention.

As sown in FIG. 6, different from FIG. 1, an Op Amp U3 replaces the shunt reference U2 and is used to control the generation of the self testing pulse signal. In the self testing circuit 2, the power source circuit includes resistor R5, voltage regulator ZD1 and capacitor C3, and is used to supply a stable DC power to the Op Amp U3. The serial connected resistors R7 and R8 are coupled to the inverting input of the op amp U3. The periodic timing circuit includes resistor R9 and capacitor C4 which are used to set the period of self testing, where capacitor C4 is coupled to the non-inverting input of the Op Amp. When the voltage on capacitor C4 increases to a level higher than the reference voltage at the inverting input, the output state of the Op Amp flips, which drives transistor Q2 to be conductive to generate a simulated leakage current signal for self-testing. The leakage current detector chip U1 detects this leakage current signal via the detector ring ZCT1, and drives the SCR Q1 to become conductive. Therefore, capacitor C4 is discharged via diode D2 and SCR Q1, which starts the next charging period.

Figure 7:
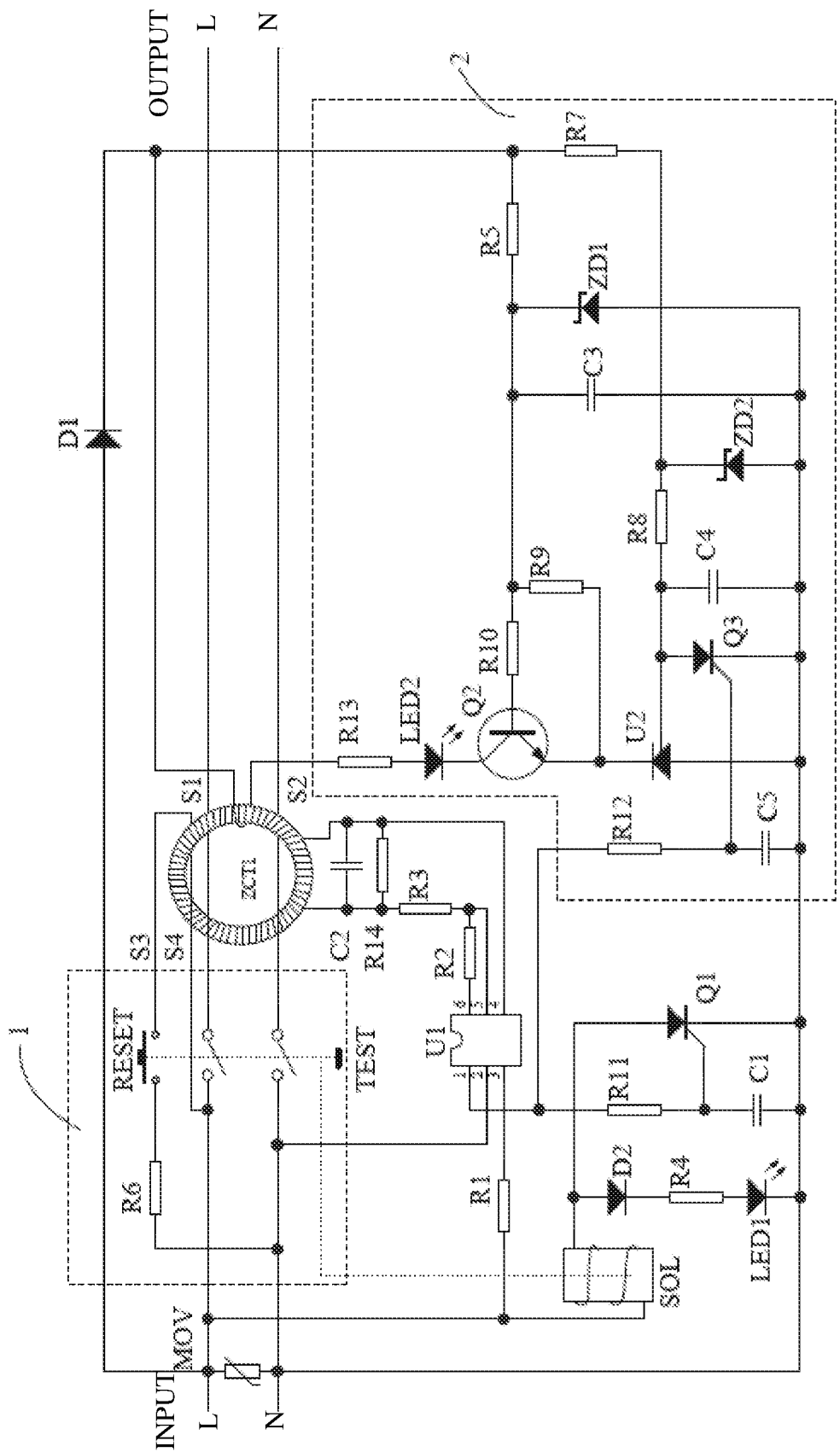
FIG. 7 is a circuit diagram showing the structure of a leakage current detection and protection device according to a seventh embodiment of the present invention.

FIG. 7 is a circuit diagram showing the structure of a leakage current detection and protection device according to a seventh embodiment of the present invention.

As shown in FIG. 7, different from FIG. 5, the leakage current detector chip U1 is supplied by the input AC power, and correspondingly, the self testing circuit 2 is supplied by the positive or negative half cycle of the AC power via diode D1. In other words, the self testing circuit 2 and the solenoid SOL operate in the same half cycle of the AC power. By setting the values of the RC circuit which is coupled to the control gates of SCRs Q1 and Q3, i.e. the values of R11, C11 and R12, C5, the SCR Q3 is made conductive before the SCR Q1 is made conductive. This way, the capacitor C4 is discharged before the coil of the solenoid SOL forms a current path, to turn off the self testing pulse signal, thereby avoiding unintended tripping of the device.

In embodiments of the present invention, by adding self testing circuits 1 and 2 to the leakage current detection and protection device, the device not only can be tested before use, but also performs self testing periodically during use and provide corresponding indication to the user. The safety of the device is greatly enhanced.

It will be apparent to those skilled in the art that various modification and variations can be made in the leakage current detection and protection circuit of the present invention without departing from the spirit or scope of the invention. Thus, it is intended that the present invention cover modifications and variations that come within the scope of the appended claims and their equivalents.

The invention claimed is:

1. A leakage current detection device for an AC power source, comprising:

a switching module coupled between a power input terminal and a power output terminal, for controlling electrical connection between the power input and power output terminals;

a leakage current detection module including a leakage current detector ring for detecting a leakage current signal and a switch driving component, the leakage current detection module being configured to control the switching module based on working periods of the switch driving component and based on whether a leakage current signal is detected; and a first self testing module, coupled to the leakage current detection module, configured to periodically generate a self testing pulse signal as a simulated leakage current signal to be detected by the detector ring, wherein the first self testing module includes a periodic timing circuit and a self testing pulse signal generating circuit coupled to each other, wherein the periodic timing circuit controls a period of the self testing pulse signal, wherein the first self testing module operates in positive half cycles of the AC power source and the switch driving component operates in negative half cycles of the AC power source, or the first self testing module operates in negative half cycles of the AC power source and the switch driving component operates in positive half cycles of the AC power source.

2. The leakage current detection device of claim 1, further comprising a second self testing module, which includes a resistor, a reset button and a wire passing through the leakage current detector ring, wherein when the reset button is depressed, a simulated leakage current is generated on the wire.

3. The leakage current detection device of claim 1, wherein the first self testing module further includes a power supply module for supplying a power to the self testing pulse signal generating circuit and/or the periodic timing circuit.

4. The leakage current detection device of claim 3, wherein the power supply module supplies power only to the self testing pulse signal generating circuit, and wherein the periodic timing circuit is coupled to directly receive power from the AC power source.

5. A leakage current detection device for an AC power source, comprising:

a switching module coupled between a power input terminal and a power output terminal, for controlling electrical connection between the power input and power output terminals;

a leakage current detection module including a leakage current detector ring for detecting a leakage current signal and a switch driving component, the leakage current detection module being configured to control the switching module based on working periods of the switch driving component and based on whether a leakage current signal is detected; and a first self testing module, coupled to the leakage current detection module, configured to periodically generate a self testing pulse signal as a simulated leakage current signal to be detected by the detector ring, wherein the first self testing module includes a periodic timing circuit and a self testing pulse signal generating circuit coupled to each other, wherein the periodic timing circuit controls a period of the self testing pulse signal, wherein the self testing pulse signal generating circuit includes a switching device, wherein the periodic timing circuit is coupled to the switching device to control a conductive state of the switching device, wherein the switching device generates the self testing pulse signal when it is controlled by the periodic timing circuit to be conductive, and wherein a timing component of the periodic timing circuit is discharged via the leakage current detection module or via the leakage current detection module and a first discharge path.

6. The leakage current detection device of claim 5, wherein the first self testing module and the switch driving component respectively operate in different half cycles of the AC power source.

7. The leakage current detection device of claim 6, wherein the self testing pulse signal generating circuit further includes a shunt reference coupled in series with the switching device, and wherein the periodic timing circuit is coupled to the shunt reference to control the conductive state of the switching device.

8. The leakage current detection device of claim 6, wherein the self testing pulse signal generating circuit further includes an operational amplifier, an output of the operational amplifier being coupled to the switching device, a non-inverting input of the operational amplifier being coupled to a biasing circuit, and an inverting input of the operational amplifier being coupled to the periodic timing circuit.

9. The leakage current detection device of claim 7, wherein the first self testing module includes a power supply module for supplying a power to the self testing pulse signal generating circuit and/or the periodic timing circuit.

10. The leakage current detection device of claim 9, wherein the power supply module supplies power only to the self testing pulse signal generating circuit, and wherein the periodic timing circuit is coupled to directly receive power from the AC power source.

11. The leakage current detection device of claim 5, wherein the first self testing module and the switch driving component respectively operate in the same half cycle of the AC power source, and wherein the timing component of the periodic timing circuit is discharged via the first discharge path.

12. The leakage current detection device of claim 11, wherein the first discharge path becomes conductive before a discharge path of the leakage current detection module becomes conductive.

13. The leakage current detection device of claim 11, wherein the first discharge path is coupled to an output of a leakage current detection chip of the leakage current detection module.

14. The leakage current detection device of claim 5, wherein the self testing pulse signal generating circuit further includes a light emitting device coupled in series with the switching device.

15. The leakage current detection device of claim 5, wherein the periodic timing circuit is coupled to the switching device via a voltage regulator, wherein the current regulator increases the period of the self testing pulse signal.

16. The leakage current detection device of claim 5, further comprising a voltage regulator coupled in parallel with the timing component.

17. The leakage current detection device of claim 5, further comprising a second self testing module, which includes a resistor, a reset button and a wire passing through the leakage current detector ring, wherein when the reset button is depressed, a simulated leakage current is generated on the wire.

* * * * *